United States Patent [19]

Spofford

[11] 4,322,631
[45] Mar. 30, 1982

[54] IMPLEMENTAL MEANS FOR A TOUCH CONTROL SYSTEM

[75] Inventor: Walter R. Spofford, Bedford, Mass.

[73] Assignee: Emhart Industries, Inc., Indianapolis, Ind.

[21] Appl. No.: 96,737

[22] Filed: Nov. 23, 1979

Related U.S. Application Data

[63] Continuation of Ser. No. 929,030, Jul. 28, 1978, abandoned, which is a continuation of Ser. No. 762,779, Jan. 25, 1977, abandoned.

[51] Int. Cl.³ .............................................. H01H 36/00
[52] U.S. Cl. ...................................... 307/39; 307/115; 307/116

[58] Field of Search .................... 307/115, 116–124, 307/30, 38, 39, 218, 203, 308, 98, 99, 100, 125, 139, 140, 215, 313; 235/92 LG; 340/147 C, 147 CV; 361/179, 181, 281; 328/5

[56] References Cited

U.S. PATENT DOCUMENTS

| | | | |
|---|---|---|---|
| 3,764,861 | 10/1973 | Orris | 307/116 X |
| 4,053,789 | 10/1977 | Schultz | 307/116 |
| 4,175,239 | 11/1979 | Sandler | 361/181 X |

*Primary Examiner*—L. T. Hix
*Assistant Examiner*—Stafford D. Schreyer
*Attorney, Agent, or Firm*—Robert F. Meyer; David W. Gomes

[57] ABSTRACT

A touch control system includes at least two capacitance means, a shunting means, and an implemental means wherein the implemental means includes at least two multiple input inverting logic gates having complementary metal oxide semiconductors (CMOS).

13 Claims, 3 Drawing Figures

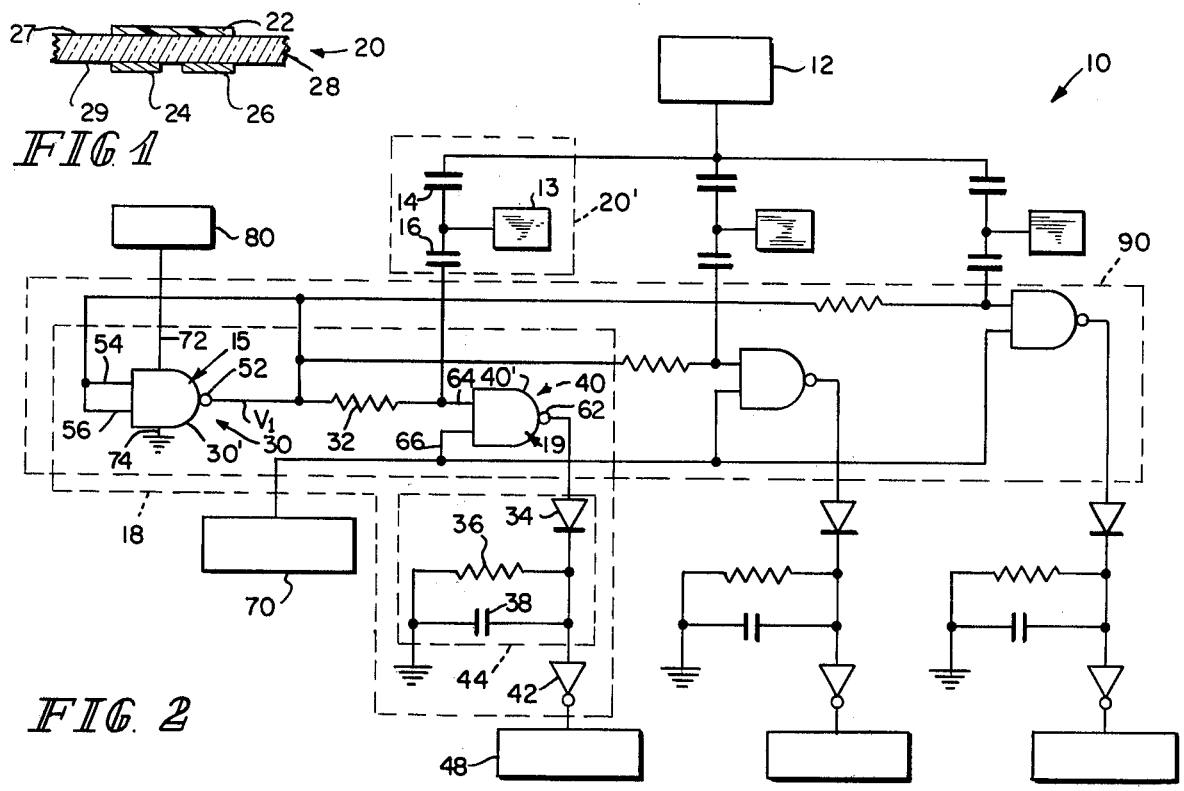
FIG. 1
FIG. 2
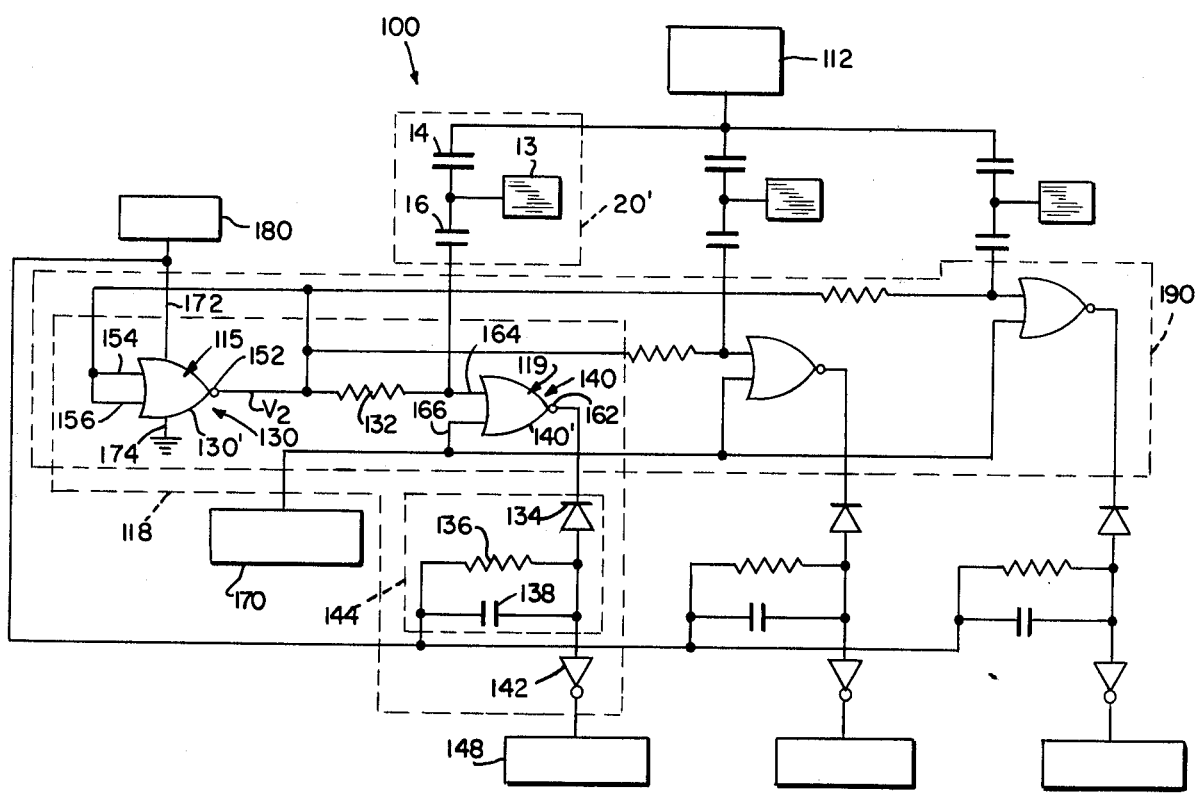
FIG. 3

IMPLEMENTAL MEANS FOR A TOUCH CONTROL SYSTEM

This is a continuation of application Ser. No. 929,030, filed July 28, 1978, now abandoned, which is a continuation of application Ser. No. 762,779, filed Jan. 25, 1977, now abandoned.

BACKGROUND OF THE INVENTION

Generally speaking, the present invention relates to touch control systems of the type adaptable for use as keyboard switches and more specifically to a touch control system which comprises at least two capacitance means, a shunting means electrically coupled to at least one of the capacitance means, and an implemental means for implementing at least one machine function which is responsive to the shunting means wherein the implemental means includes at least two multiple input inverting logic gates.

While there are many touch pad techniques in the art the present system was developed for the "NESA" touch pad technique as it is described in Pittsburg Plate Glass Bulletins entitled "NESA and NESATRON® Glass." In substantially all touch control systems it is necessary that the touch or no touch condition of the touch pad be detected in order to implement a desired function. Accordingly, the implemental circuit must distingush between the electrical signal amplitude where there is no touch contact to the touch pad and the electricl signal amplitude where there is touch contact with the pad. It is therefore desireable that the implemental circuit include devices with a precisely defined threshold which will clearly and discretely detect the difference between large and small electrical signals. Previous touch control systems have utilized P-channel metal oxide semiconductors (PMOS) as threshold detection devices; however, such devices do not exhibit clean threshold characteristics. Furthermore, PMOS characteristics in general vary widely from device to device making reproducibility of such devices on a large scale with uniform characteristics very difficult. Because of the characteristics described above; PMOS devices when utilized in touch control systems perform inefficiently and thereby result in increased cost of the overall touch control system. By utilizing multiple input inverting logic gates which include complementary metal oxide semiconductors (CMOS) at least three shunting means may be implemented by a single integrated circuit package thereby resulting in an implemental means having precisely defined threshold characteristics which also requires a minimum of electronic circuitry.

Accordingly, it is a feature of the present invention to provide a touch control system wherein an implemental means is low cost and highly efficient. Another feature of the present invention is to provide a touch control system comprising at least two capacitance means, a shunting means, and an implemental means wherein the implemental means includes at least two multiple input inverting logic gates. Another feature of the present invention is to provide a touch control system wherein the multiple input inverting logic gates include complementary metal oxide semiconductors (CMOS). Yet another feature of the present invention is to provide a touch control system wherein the multiple input inverting logic gates are NAND gates. Yet another feature of the present invention is to provide a touch control system wherein the multiple input inverting logic gates are NOR gates. Still yet another feature of the present invention is to provide a touch control system wherein three implemental means are contained within a single integrated circuit package and respond to three shunting means. Still another feature of the present invention is to provide a touch control system wherein the three implemental means include four multiple input inverting logic gates. Yet another feature of the present invention is to provide a touch control system wherein the four multiple input inverting logic gates comprise a readily available quad two input gated integrated circuit.

These and other features will become apparent from the following description when viewed in conjunction with the accompanying drawings which follow:

BRIEF DESCRIPTION OF THE DRAWINGS

FIG. 1 is a cross-sectional view of a touch pad.
FIG. 2 is a wiring diagram of a first embodiment of a touch control system.
FIG. 3 is a wiring diagram of a second embodiment of a touch control system.

DESCRIPTION OF THE PREFERRED EMBODIMENT

Referring to FIG. 1, a touch pad 20 (similar to that described by American Microsystems, Inc in a bulletin entitled "Touch-MOS ™ Switching" dated June 1, 1975) includes a dielectric material 28 which may comprise glass, a metallic coating of tin oxide 22 disposed on a surface 27 of the dielectric material 28, and two metal strips 24 and 26 disposed in spaced parallel relation to the coating of tin oxide 22 on another surface 29 of the dielectric material 28. In operation, metal strip 24 is capacitively coupled to the coating of tin oxide 22 and the coating of tin oxide 22 is capacitively coupled to metal strip 26. When the coating of tin oxide 22 is touched an electrical signal will be shunted thereby substantially reducing the output signal from touch pad 20. Operation of touch pad 20 has also been achieved in the embodiments described hereinafter with the coating of tin oxide 22 removed.

Referring to FIG. 2, a first embodiment of a touch control system 10 includes a master oscillator 12, an equivalent electrical circuit 20' of touch pad 20 (FIG. 1), an implemental means 18, a machine function 48, a power supply source 80, and a bias voltage source 70.

Master oscillator 12 may be any square wave oscillator capable of operating within a frequency range of substantially 100–500 KHZ. Power supply source 80 may be any conventional DC power supply source which is compatible with CMOS integrated circuit requirements. The square wave signal produced by master oscillator 12 should operate substantially within the power supply limits of power supply source 80. Bias voltage source 70 may be any means for supplying a bias voltage; however, as shown in the first embodiment of touch control system 10 bias voltage source 70 must be less than or substantially equal to the voltage of power supply source 80.

The equivalent electrical circuit 20' of touch pad 20 (FIG. 1) includes a capacitance means 14 (representative of the capacitance between the coating of tin oxide 22 and metal strip 24 depicted in FIG. 1), a capacitance means 16 (representative of the capacitance between the coating of tin oxide 22 and metal strip 26 depicted in FIG. 1), and a shunting means 13 (representative of the coating of tin oxide 22 depicted in FIG. 1). Capacitance means 14 is electrically coupled to master oscillator 12 and to capacitance means 16. Capacitance means 16 is in turn electrically coupled to implemental means 18. Shunting means 13 is electrically coupled to both capacitance means 14 and capacitance means 16 whereby the square wave signal produced by master oscillator 12 may be effectively shunted to ground potential as it passes through capacitance means 14.

Implemental means 18 for implementing a machine function 48 is electrically coupled to equivalent electrical circuit 20' of touch pad 20 (FIG. 1) and includes two multiple input inverting logic gates 30 and 40, a rectifying means 44, and a buffering means 42.

Multiple input inverting logic gate 30 includes complementary metal oxide semiconductors (CMOS) 15 and in the first embodiment is a two input NAND gate 30'. The complementary metal oxide semiconductors 15 are typically CMOS transistors. NAND gate 30' is self biased by electrically coupling its output 52 to its two inputs 54 and 56 thereby establishing a threshold bias voltage $V_1$ which appears at output 52 and is transmitted to an input 64 of multiple input inverting logic gate 40 through a resistor 32. For purposes of the first embodiment of this disclosure threshold bias voltage shall mean that voltage determined by the transfer curve of a two input NAND gate of the CMOS variety when the output voltage of the NAND gate is substantially equal to its input voltage (a self biased NAND gate). A positive voltage terminal 72 of NAND gate 30' is electrically coupled to power supply souce 80 and a negative voltage terminal 74 of NAND gate 30' is electrically coupled to ground potential (the negative terminal of power supply source 80).

Multiple input inverting logic gate 40 includes complementary metal oxide semiconductors (CMOS) 19 and in the first embodiment is a two input NAND gate 40'. As in the case of gate 30 the complementary metal oxide semiconductors 19 are typically CMOS transistors. NAND gate 40' detects the shunting of the square wave signal produced by master oscillator 12 and is therefore responsive to shunting means 13. Accordingly, an input 64 of NAND gate 40' in addition to being electrically coupled to the output 52 of NAND gate 30' is also electrically coupled to a capacitance means 16 of equivalent electrical circuit 20' of touch pad 20 (FIG. 1). Another input 66 of NAND gate 40' is electrically coupled to bias voltage source 70 which may be power supply source 80 for certain size touch pads 20 (FIG. 1); however, in general for touch control system 10, bias voltage source 70 will be less than the voltage of power supply source 80 but greater than the threshold bias voltage $V_1$ appearing at the output 52 of NAND gate 30'. An output 62 of NAND gate 40' is electrically coupled to rectifying means 44.

By utilizing complementary metal oxide semiconductors 15 and 19 within implemental means 18 a single package of at least two multiple input inverting logic gates 30 and 40 may be produced with no adjustments required during production having well matched threshold characteristics thereby making it possible to establish a threshold bias voltage $V_1$ by self biasing one of such gates 30 and slave the other gate 40 to the self-biased gate 30.

Rectifying means 44 includes a diode 34, a resistor 36 and a capacitance means 38. The anode of diode 34 is electrically coupled to the output 62 of NAND gate 40'. The cathode of diode 34 is electrically coupled to the parallel combination of resistor 36 and capacitance means 38. The cathode of diode 34 is also electrically coupled to buffering means 42. The parallel combination of resistor 36 and capacitance means 38 is connected to ground potential. Rectifying means 44 rectifies and filters the signal appearing at the output 62 of NAND gate 40' to produce a DC level voltage.

Buffering means 42 may be an inverter; however, depending upon the machine function 48 to be implemented it may not be necessary to include a buffering means 42 in implemental means 18. Machine function 48 may be any one or more of a variety of functions to be performed by a machine and may include an electronic control circuit for controlling the performance of a particular function of a machine.

As shown in FIG. 2 two additional multiple input inverting logic gates 40 including complementary metal oxide semiconductors 19 may be utilized to detect the shunting of two additional shunting means 13. Each of the two additional multiple input inverting logic gates 40 is a NAND gate 40' and each NAND gate 40' in combination with self-biased NAND gate 30', an additional rectifying means 44, and an additional buffering means 42 comprise an additional implemental means 18. Accordingly, a readily available quad two-input NAND gate integrated circuit 90 of the CMOS variety may be utilized to implement three machine functions 48 in response to three shunting means 13 wherein three implemental means 18 each include NAND gate 30', a NAND gate 40', a rectifying means 44 and a buffering means 42. It is again stressed that the ability to precisely match the transfer characteristics of complementary metal oxide semiconductors in a single quad two-input NAND gate integrated circuit make such readily available circuit packages particularly adaptable for efficiently inplementing machine functions from a plurality of touch pads. One of the NAND gates 30' of the quad two-input NAND gate integrated circuit 90 is self biased and because of the well matched transfer characteristics of CMOS 15 and 19 is capable of providing a threshold biased voltage $V_1$ to slave each of the other three NAND gates 40' through a corresponding resistor 32. Each of the NAND gates 40' in turn detects the shunting of one of the three shunting means 13. The outputs 62 of each of the NAND gates 40' are electrically coupled to a rectifying means 44 and a buffering means 42 thereby implementing a machine function 48.

Referring to FIG. 3, a second embodiment of a touch control system 100 includes a master oscillator 112, an equivalent circuit 20' of touch pad 20 (FIG. 1), an implemental means 118, a machine function 148, a power supply source 180, and a bias voltage source 170.

The equivalent electrical circuit 20' of touch pad 20 (FIG. 1) as shown in FIG. 3 is substantially the same as the equivalent electrical circuit 20' as shown in FIG. 2, accordingly the same reference numericals have been given to the circuit 20' in FIG. 3 as those of the same circuit 20' in FIG. 2 and the description of equivalent electrical circuit 20' provided hereinabove is reiterated here.

Master oscillator 112 again may be any square wave oscillator capable of operating within a frequency range of substantially 100–500 KHZ. Also power supply source 180 may be any conventional DC power supply source which is compatible with CMOS integrated circuit requirements. As in the first embodiment the square wave signal produced by master oscillator 112 should operate substantially within the power supply limits of power supply source 180. Also as in the first embodiment bias voltage source 170 may be any means for supplying a bias voltage; however, as shown in the second embodiment of a touch control system 100 bias voltage source 170 must be less than or substantially equal to the threshold bias voltage $V_2$ appearing at an output 152 of multiple input inverting logic gate 130 of implemental means 118. For certain touch pad techniques bias voltage source 170 may be substantially at ground potential.

Implemental means 118 for implementing a machine function 148 is electrically coupled to equivalent electrical circuit 20' of touch pad 20 (FIG. 1) and includes two multiple input inverting logic gates 130 and 140, a rectifying means 144, and a buffering means 142.

Multiple input inverting logic gate 130 includes complementary metal oxide semiconductors (CMOS) 115 and in the second embodiment is a two input NOR gate 130'. The complimentary metal oxide semiconductors are typically CMOS transistors. NOR gate 130 is self biased by electrically coupling its output 152 to its two inputs 154 and 156 thereby establishing a threshold bias voltage $V_2$ which appears at output 152 and is transmitted to an input 164 of multiple input inverting logic gate 140 through a resistor 132. For purposes of the second embodiment of this disclosure threshold bias voltage shall mean that voltage determined by the transfer curve of a two input NOR gate of the CMOS variey wherein the output voltage of the NOR gate is substantially equal to its input voltage (a self biased NOR gate). A positive voltage terminal 172 of NOR gate 130' is electrically coupled to power supply source 180 and a negative voltage terminal 174 of NOR gate 130' is electrically coupled to ground potential.

Multiple input inverting logic gate 140 includes complementary metal oxide semiconductors (CMOS) 119 and in the second embodiment is a two input NOR gate 140'. As in the case of gate 130 the complementary metal oxide semiconductors 119 are typically CMOS transistors. NOR gate 140' detects the shunting of the square wave signal produced by master oscillator 112 and is therefore responsive to shunting means 13. Accordingly, an input 164 of NOR gate 140' in addition to being electrically coupled to the output 152 of NOR gate 130' is also electrically coupled to a capacitance means 16 of equivalent electrical circuit 20' of touch pad 20 (FIG. 1). Another input 166 of NOR gate 140' is electrically coupled to bias voltage source 170. For touch control system 100, bias voltage source 170 should be less then the threshold bias voltage $V_2$ appearing at the output 152 of NOR gate 130' but greater than or equal to ground potential. An output 162 of Nor gate 140' is electrically coupled to rectifying means 144.

Again by utilizing complementary metal oxide semiconductors 115 and 119 within implemental means 118 a single package of at least two multiple input inverting logic gates 130 and 140 may be produced with no adjustments required during production having well matched threshold characteristics thereby making it possible to establish a threshold bias voltage $V_2$ by self biasing one of such gate gates 130 and slave the other gate 140 to the self biased gate 130.

Rectifying means 144 includes a diode 134, a resistor 136, and a capacitance means 138. The cathode of diode 134 is electrically coupled to the output 162 of NOR gate 140'. The anode of diode 134 is electrically coupled to the parallel combination of resistor 136 and capacitance means 138. The anode of diode 134 is also electrically coupled to buffering means 142. The parallel combination of resistor 136 and capacitance means 138 is electrically coupled to power supply source 180. Rectifying means 144 rectifies and filters the signal appearing at the output 162 of NOR gate 140' to produce a DC level voltage.

Buffering means 142 may be an inverter; however, depending upon the machine function 148 to be implemented it may not be necessary to include a buffering means 142 in implemental means 118. Machine function 148 may be any one or more of a variety of functions to be performed by a machine. However, machine function 148 may also include an electronic control circuit for controlling the performance of a particular function of a machine.

As shown in FIG. 3 two additional multiple input inverting logic gates 140 including complementary metal oxide semiconductors 119 may be utilized to detect the shunting of two additional shunting means 13. Each of the two additional multiple input inverting logic gates 140 is a NOR gate 140' and each NOR gate 140' in combination with self-biased NOR gate 130', an additional rectifying means 144, and an additional buffering means 142 comprise an additional implemental means 118. Accordingly, a quad two-input NOR gate integrated circuit 190 of the CMOS variety may be utilized to implement three machine functions 148 in response to three shunting means 13 wherein three implemental means 118 each include NOR gate 130', a NOR gate 140', a rectifying means 144, and a buffering means 142. One of the NOR gates 130' of the quad two-input NOR gate integrated circuit 190 is self-biased and because of the well matched transfer characteristics of CMOS 115 and 119 is capable of providing a threshold biased voltage $V_2$ to slave each of the other three NOR gates 140' through a corresponding resistor 132. Each of the NOR gates 140' in turn detects the shunting of one of the three shunting means 13. The outputs 162 of each of the NOR gates 140' are electrically coupled to a rectifying means 144 and a buffering means 142 thereby implementing a machine function 148.

With the exception of the polarities of the output signals of multiple input inverting logic means 30 and 40 (FIG. 2) and 130 and 140 (FIG. 3) the operations of the above described embodiments are substantially the same. In operation, in the first embodiment as shown in FIG. 1, master oscillator 12 supplies a square wave signal operating within the power supply limits of power supply source 80 to capacitance means 14. When no touch contact is being made with shunting means 13 the square wave signal is capacitively transmitted through capacitance mans 14 and 16 to an input 64 of multiple input inverting logic gate 40. Coincidently, self biased multiple input inverting logic gate 30 is producing a threshold bias voltage $V_1$ which is also being transmitted to the input 64 of multiple input logic gate 40. Accordingly, the square wave signal being supplied by master oscillator 12 is made to oscillate symmetrically about the threshold bias voltage $V_1$ established by multiple input inverting logic gate 30 which causes the output voltage of multiple input inverting logic gate 40 to oscillate from approximately zero volts to substantially the voltage being supplied by power supply source 80. This square wave signal is then rectified and filtered by the combination of diode 34, resistor 36, and capacitance means 38 which comprise recityfing means 44 to produce a DC level signal. The DC level signal is substantially the voltage of power supply source 80 when shunting means 13 is in a no touch condition. The DC level signal is then buffered by buffering means 42, and transmitted to machine function 48; however, for certain machine functions 48 it may not be necessary to buffer the DC level signal before it is transmitted and therefore buffering means 42 may be deleted.

When touch contact is being made with shunting means 13 the square wave signal being produced by master oscillator 12 is effectively shunted to ground potential after being capacitively transmitted through capacitance means 14 thereby substantially decreasing the magnitude of the signal being capacitively transmitted through capacitance means 16 to the input 64 of multiple input inverting logic gate 40. Since the square wave signal appearing at input 64 is made to swing symmetrically about the threshold bias voltage $V_1$ established by multiple input inverting logic gate 30 the magnitude of the output voltage of multiple input inverting logic gate 40 will be negligible. The exact ratio of the output voltage of multiple input inverting logic gate 40 in a no touch condition to the output voltage of multiple input inverting logic gate 40 in a touch condition is determined by the particular transfer characteristics of both gates 30 and 40. Accordingly, the more precisely defined and evenly matched the transfer characteristics of multiple input inverting logic gates 30 and 40, the more efficient the total control system 10.

Although the polarities of multiple input inverting logic gates 130 and 140 of the second embodiment (FIG. 3) are different from those of multiple input inverting logic gates 30 and 40 of the first embodiment (FIG. 2) thereby resulting in some circuit changes as shown in FIG. 3 the basic operation of the second embodiment is substantially the same as that described above.

What is claimed is:

1. In a touch control system of the type which includes means for supplying an electrical signal, capacitance means coupled to said means for supplying for capacitively transmitting said electrical signal, means electrically coupled to said capacitance means for shunting said electrical signal to substantially ground potential in response to being touched, and at least one means coupled to said capacitance means and responsive to said shunting means for implementing said electrical signal to control a function, the improvement wherein said implemental means comprises at least two multiple input inverting logic gates having matched threshold characteristics wherein one of said multiple input inverting logic gates is self-biased to establish a threshold bias voltage, and means for coupling said threshold bias voltage and said electrical signal transmitted by said capacitance means to the other said inverting logic gate for producing an output signal from said other logic gate which is responsive to the presence and absence of said electrical signal and thus responsive to said means for shunting being touched.

2. The touch control system as recited in claim 1 wherein said multiple input inverting logic gates include complementary metal oxide semiconductors.

3. The touch control system as recited in claim 2 wherein said multiple input inverting logic gates are NAND gates.

4. The touch control system as recited in claim 2 wherein said multiple input inverting logic gates are NOR gates.

5. The touch control system as recited in claim 1 wherein said other multiple input inverting logic gate has an input electrically coupled to said self-biased logic gate and to said capacitane means.

6. The touch control system as recited in claim 5 further comprising a bias voltage source electrically coupled to another input of said other multiple input inverting logic gate.

7. The touch control system as recited in claim 1 wherein said implemental means further includes a rectifying means electrically coupled to an output of said other multiple input inverting logic gate for rectifying output signals therefrom.

8. The touch control system as recited in claim 7 wherein said rectifying means includes a rectifier diode electrically coupled in series to a parallel filter combination of a resistor and a capacitor.

9. The touch control system as recited in claim 7 wherein said implemental means further includes a buffering means electrically coupled to receive the output of said rectifying means.

10. In a touch control system of the type which includes means for supplying an electrical signal, at least three capacitance means coupled to receive said electrical signal for capacitively transmitting said electrical signal, at least three means for shunting said electrical signal to substantially ground potential in response to being touched, one each of said shunting means being electrically coupled to a separate one of said capacitance means, and means responsive to each of said shunting means for implementing said electrical signal, the improvement wherein said implemental means comprises at least four multiple input inverting logic gates having matched threshold characteristics wherein one of said logic gates is self-biased to establish a threshold bias voltage, and means for coupling said threshold bias voltage and each said electrical signal transmitted by a separate capacitance means to a separate of the other of said inverting logic gates for producing output signals from said other logic gates which output signals are responsive to the presence and absence of said electrical signals from their respectively coupled separate capacitance means and thus responsive to each of said means for shunting being touched.

11. The touch control system as recited in claim 10 wherein said self-biased multiple input inverting logic gate has output and input terminals which are coupled together to establish said threshold bias voltage at said output terminal.

12. The touch control system as recited in claim 11 wherein said multiple input inverting logic gates comprise a quad two input NAND gate integrated circuit which includes complementary metal oxide semiconductors.

13. The touch control system as recited in claim 11 wherein said multiple input inverting logic gates comprise a quad two input NOR gate integrated circuit which includes complementary metal oxide semiconductors.

* * * * *